(12) United States Patent
Tsai

(10) Patent No.: US 10,044,488 B1
(45) Date of Patent: Aug. 7, 2018

(54) INTERPOLATED CHANNELIZER WITH COMPENSATION FOR NON-LINEAR PHASE OFFSETS

(71) Applicant: Raytheon Company, Waltham, MA (US)

(72) Inventor: David H. Tsai, Dallas, TX (US)

(73) Assignee: Raytheon Company, Waltham, MA (US)

( * ) Notice: Subject to any disclaimer, the term of this patent is extended or adjusted under 35 U.S.C. 154(b) by 82 days.

(21) Appl. No.: 15/048,260

(22) Filed: Feb. 19, 2016

Related U.S. Application Data

(60) Provisional application No. 14/691,988, filed on Apr. 21, 2015.

(51) Int. Cl.
*H04K 1/10* (2006.01)
*H04L 27/28* (2006.01)
*H04L 5/00* (2006.01)
*H04B 7/26* (2006.01)

(52) U.S. Cl.
CPC ......... *H04L 5/0085* (2013.01); *H04B 7/2621* (2013.01); *H04L 5/0048* (2013.01)

(58) Field of Classification Search
CPC ............. H04L 27/2652; H04L 27/2631; H04L 5/0085; H04L 5/0048; H04B 7/2621
See application file for complete search history.

(56) References Cited

U.S. PATENT DOCUMENTS

| | | | | |
|---|---|---|---|---|
| 6,324,559 B1 * | 11/2001 | Hellberg | ............ | H03H 17/0213 708/315 |
| 6,356,569 B1 * | 3/2002 | Sonalkar | ............ | H03H 17/0213 370/210 |
| 6,393,066 B1 | 5/2002 | Moretti et al. | | |
| 6,570,514 B1 * | 5/2003 | Velazquez | ........... | H03M 1/1052 341/118 |
| 7,142,607 B2 * | 11/2006 | Song | ......................... | H04L 5/06 370/537 |
| 7,675,985 B1 | 3/2010 | Watson | | |
| 8,452,826 B2 | 5/2013 | Hinson | | |
| 8,761,280 B1 * | 6/2014 | Harris | ................. | H04L 27/2602 375/259 |
| 2004/0042557 A1 * | 3/2004 | Kabel | ............... | H03H 17/0266 375/260 |

* cited by examiner

*Primary Examiner* — Shuwang Liu
*Assistant Examiner* — Sung Ahn
(74) *Attorney, Agent, or Firm* — Burns & Levinson, LLP; Joseph M. Maraia

(57) ABSTRACT

A system and method for interpolating non-integer oversamples in a receiver receives a plurality of samples, the plurality of samples having a quantity which has a non-integer ratio to a number of channels of a channelizer of the receiver. A non-linear phase correction is applied to the plurality of samples.

6 Claims, 4 Drawing Sheets

INTERPOLATED CHANNELIZER WITH COMPENSATION FOR NON-LINEAR PHASE OFFSETS

CROSS-REFERENCE TO RELATED APPLICATIONS

This application is a continuation of U.S. application Ser. No. 14/691,988, filed Apr. 21, 2015, entitled, "Interpolated Channelizer with Compensation for Non-Linear Phase Offsets," which is incorporated herein by reference in its entirety for all purposes.

BACKGROUND

1. Technical Field

This disclosure is related to digital channelizers and, more particularly, to digital channelizers having compensation for non-linear phase offsets.

2. Discussion of Related Art

Frequency Division Multiple Access (FDMA) provides access for multiple users to a single channel by subdividing the channel into multiple sub-channels. Each user is allocated one or a subset of all the channels, and the user's signal is used to modulate a carrier of the allocated sub-channel. A single-channel receiver may be used to demodulate a single assigned channel, or a multichannel receiver may demodulate a selected range of channels.

In an analog system, each receiver has a local oscillator (LO) tuned to the frequency of the channel to be demodulated. The LO signal is multiplied by the received signal to generate an intermediate frequency (IF) signal, which is applied to a band-pass filter (BPF). The BPF has a passband selected to filter out all signals except the channel to be received. The output signal from the BPF can be digitized and processed subsequently, if desired.

SUMMARY

According to one aspect, a method for interpolating non-integer oversamples in a receiver is provided. The method includes: receiving a plurality of samples, the plurality of samples having a quantity which has a non-integer ratio to a number of channels of a channelizer of the receiver; and applying a non-linear phase correction to the plurality of samples.

In some exemplary embodiments, the non-linear phase correction is applied in accordance with $$y_k(t) = e^{\frac{-2\pi j(floor(\frac{Mt}{L}))k}{N}} * \left[\sum_{n=0}^{N-1}\left[\sum_{m=0}^{T-1} x_{floor(\frac{Mt}{L})t}(n+mN) * \bar{h}_{nL+MtmodL}(m)\right] * e^{\frac{-2\pi jnk}{N}}\right];$$

where N=number of channels, M=decimation factor, T=number of taps per branch, k=channel index, t=decimated time, $h_n(m)=h(n+Nm)$, $x_{Mt}(n)=x(Mt+n)$, and total taps in the filter=T*N.

In some exemplary embodiments, the non-linear phase correction is applied via a fast Fourier transform (FFT).

In some exemplary embodiments, the non-linear phase correction is applied via a MUX/negate operation.

According to another aspect, a receiver system for interpolating non-integer oversamples is provided. The receiver system includes an input for receiving a plurality of samples, the plurality of samples having a quantity which has a non-integer ratio to a number of channels of a channelizer of the receiver. The receiver system also includes a processor for applying a non-linear phase correction to the plurality of samples.

In some exemplary embodiments, the non-linear phase correction is applied in accordance with $$y_k(t) = e^{\frac{-2\pi j(floor(\frac{Mt}{L}))k}{N}} * \left[\sum_{n=0}^{N-1}\left[\sum_{m=0}^{T-1} x_{floor(\frac{Mt}{L})t}(n+mN) * \bar{h}_{nL+MtmodL}(m)\right] * e^{\frac{-2\pi jnk}{N}}\right];$$

where N=number of channels, M=decimation factor, T=number of taps per branch, k=channel index, t=decimated time, $h_n(m)=h(n+Nm)$, $x_{Mt}(n)=x(Mt+n)$, and total taps in the filter=T*N.

In some exemplary embodiments, the non-linear phase correction is applied via a fast Fourier transform (FFT).

In some exemplary embodiments, the non-linear phase correction is applied via a MUX/negate operation.

BRIEF DESCRIPTION OF THE DRAWINGS

The present disclosure is further described in the detailed description which follows, in reference to the noted plurality of drawings by way of non-limiting examples of embodiments of the present disclosure, in which like reference numerals represent similar parts throughout the several views of the drawings.

DETAILED DESCRIPTION

Figure 1:
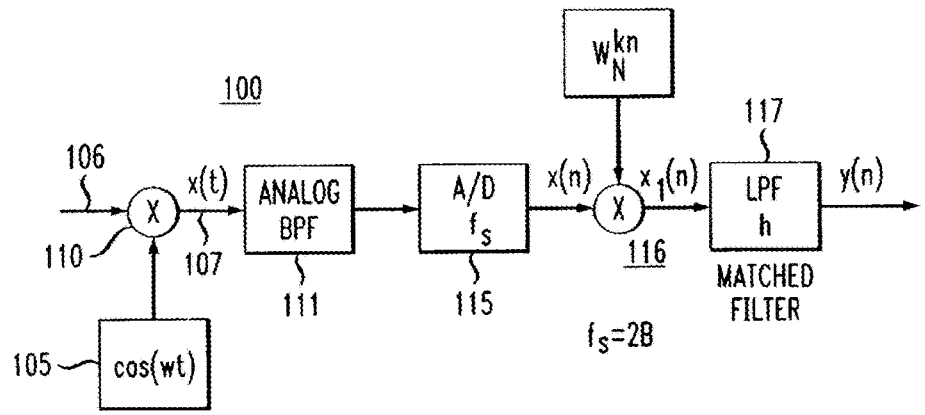
FIG. 1 includes a schematic block diagram of a conventional receiver.

FIG. 1 includes a schematic block diagram of a conventional receiver. Referring to FIG. 1, conventional receiver 100 includes a local oscillator (LO) 105 having frequency co. A signal mixer 100 mixes the amplified incoming FDMA signal 106 with the LO 105 output to produce a signal 107 with a fixed intermediated frequency (IF). An analog BPF 111 selects the desired channel and an analog-to-digital converter (ADC) 115 converts the resulting output to digital form by sampling the analog signal at an appropriated frequency. Generally, the sampling frequency is at least twice the channel bandwidth to satisfy the Nyquist requirement.

The sampled digital data, x(n), is bandshifted digitally by digital detector 116 by multiplying with a phasor $e^{-j2\pi(kn/N)}$ denoted by $W_N kn$, where k denotes the channel selected by the receiver. When there are multiple channels contained in the received signal, then one such receiver is needed for each of the channels. The resulting signal is low-pass filtered using a digital low pass filter 117 and then downsampled. All of the processes following digitization of the band-passed IF signal can be performed with a digital computer or specialized circuits well known in the art.

Figure 2:
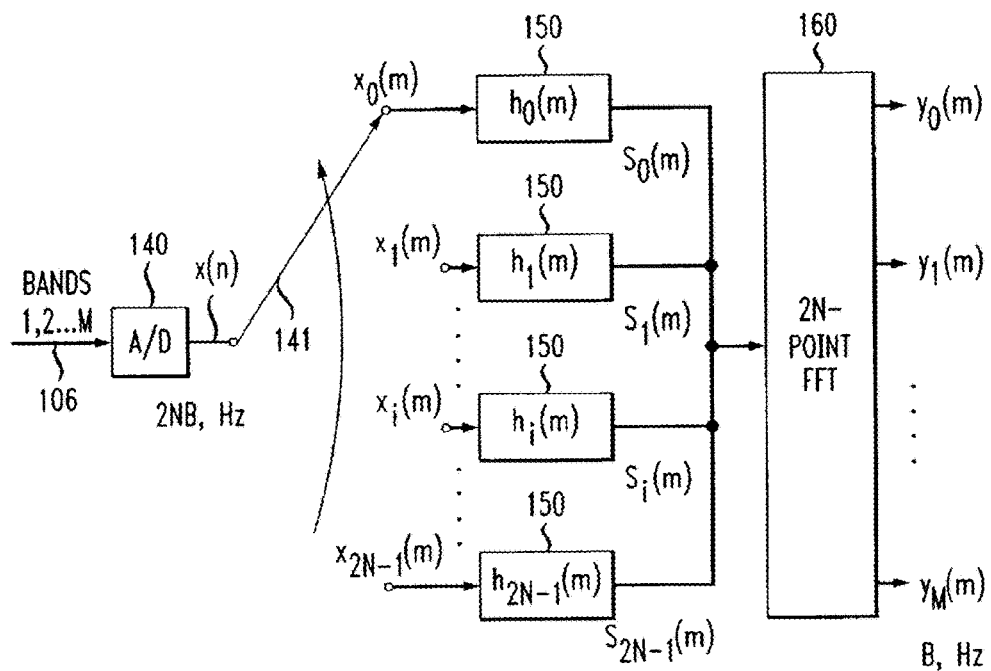
FIG. 2 includes a schematic block diagram of a conventional polyphase channelizer.

FIG. 2 includes a schematic block diagram of a conventional polyphase channelizer. Referring to FIG. 2, in a conventional polyphase approach to digital channelization, M channels of bandwidth B are received simultaneously in a FDMA signal 106. After M channels, each of bandwidth B, are passed through an analog BPF having a passband of at least M×B (not shown), they are output to an A/D converter 140, which samples at some rate that is at least equal to the Nyquist rate (2 MB) for a signal of bandwidth MB. In FIG. 2, the data is sampled at 2NB, where N is greater then or equal to M. It should be noted that N does not have to be greater than or equal to M. There are undersampled applications as well, and the present disclosure is applicable to those cases. The digital output x(n) is applied to a 2N pole commutator 141, which distributes the input data x(n) to 2N filters 150. Each filter 150 is updated once every 2N points. Filters 150 perform the channel extraction function. The time series output of filters 150 is applied to respective inputs of an FFT processor 160, which processes the data once every 2N points to produce 2N complex outputs of which M outputs are chosen, each representing the bandshifted subchannel signal at B Hz, the update rate of FFT processor 160. Only M outputs of FFT processor 160 are required since the sample rate 2NB can be higher than the minimum required sample rate 2 MB. The filter updates at an M rate, but all FFT outputs are valid. For the example shown, only one-half of the outputs of the FFT are necessary due to Nyquist.

Typically, channelizers have integer m/n ratios for oversample such that the number of channels is divisible by the downsample rate. This is desirable so that the resulting signals are just a linear frequency rotation of the desired bandwidth. If the number of channels is not divisible by m, then the resulting signal may have frequency offsets which are non-linear, and has to be compensated for on a sample-by-sample basis. Without the compensation, the channelizer output is cannot be used for processing. Specifically, for oversampled channelizers, the phase offsets vary non-linearly, sample by sample, and channel by channel. According to the present disclosure, the non-linear offsets are compensated for, such that the resulting signal is frequency centered and usable for post processing. The use of channelizers and oversampled or undersampled channelizers is common where the number of channels is evenly divisible by the oversample rate. However, the present disclosure is directed to providing for processing with non-divisible downsample rates. This allows for more flexibility in the system of the disclosure for frequency planning more options for bandwidths.

Conventional frequency planning requires modification of radio frequency (RF) local oscillators (LO's) and analog-to-digital converter (ADC) sample rates to provide bandwidths appropriate for current digital channelizers. Achieving output channel bandwidths digitally requires additional signal processing. Thus, the exemplary embodiments set forth in the present disclosure provide downsampled channelized output channels with non-integer oversampling ratios relative to the number of channels. The approach of the disclosure provides digital channelization of a spectrum to non-integer ratios relative to the number of channels. The approach of the disclosure combines an interpolation filter with the digital channelizer and corrects for non-linear phase offsets on the output channels.

Frequency planning for radar systems requires the selection of RF mixers so that the downconverted spectrums can be sampled by ADCs to cover the required spectrum. With existing systems and/or hardware, additional flexibility in processing in ADC sample rates provides the ability to limit RF modification and/or complexity. For a sampling frequency that requires a non-integer oversampling rates relative to the number of channels, a straightforward digital signal processing approach results in a resource-intense implementation.

Figure 3A:
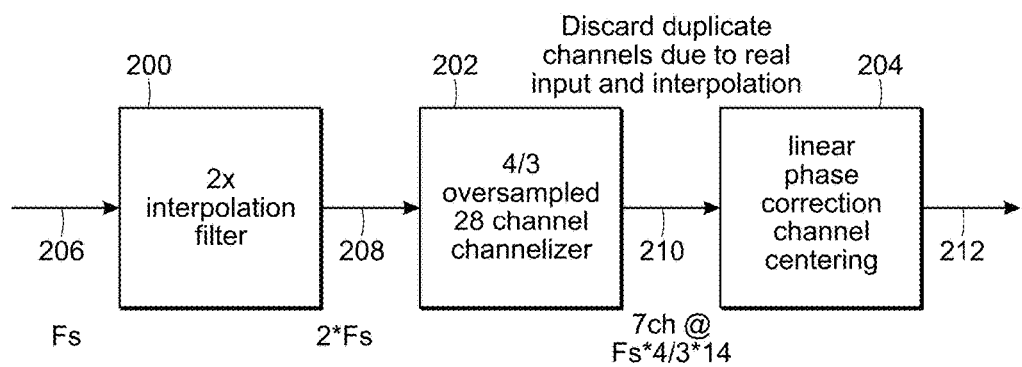
FIGS. 3A and 3B include schematic system block diagrams which illustrate conventional channelizer processing and channelizer processing according to exemplary embodiments, respectively, using the example of real input 4/3 oversampling and a 14-channel channelizer.
Figure 3B:
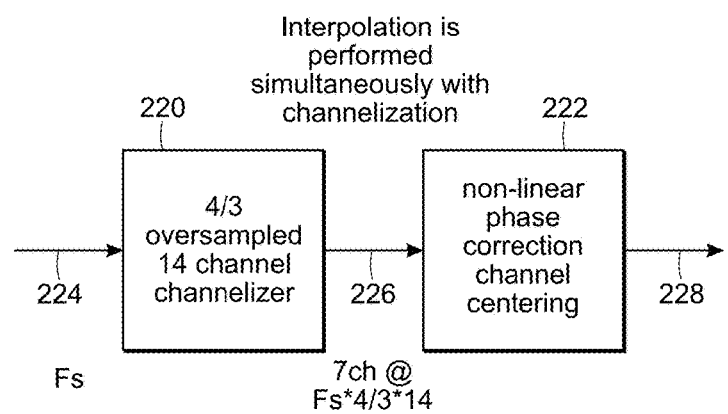

For example, a 4/3 oversample for a 16-channel channelizer requires the channelizer to receive 12 new samples (16×3/4) per processing clock. A 4/3 oversample for a 14-channel channelizer requires the channelizer to receive 10.5 new samples per processing clock. FIGS. 3A and 3B include schematic system block diagrams which illustrate conventional channelizer processing and channelizer processing according to exemplary embodiments, respectively, using the example of real input 4/3 oversampling and a 14-channel channelizer. Referring to FIG. 3A, in the conventional configuration, a signal Fs is input to a 2× interpolation filter 200 at input 206. A 2× interpolated signal 2*Fs from interpolation filter 200 is input at 208 to a 4/3 oversampled 28-channel channelizer 202. Duplicate channels due to real input and interpolation are discarded and information for seven channels @ Fs*4/3*14 is output on 210 to a linear phase correction channel centering block 204. Phase-corrected and channel-centered information is output at 204.

Referring to FIG. 3B, the optimized digital signal processing implementation of the present disclosure is illustrated. Referring to FIG. 3B, a signal Fs is input at 224 to a 4/3 oversampled 14-channel channelizer 220. According to the exemplary embodiments, interpolation is combined and performed simultaneously at 220 with channelization. The resulting output at 226, which includes information for seven channels @ Fs*4/3*14, is applied to non-linear phase correction and channel centering block 222. Non-linear phase-corrected and channel-centered information is output at 228.

Figure 4A:
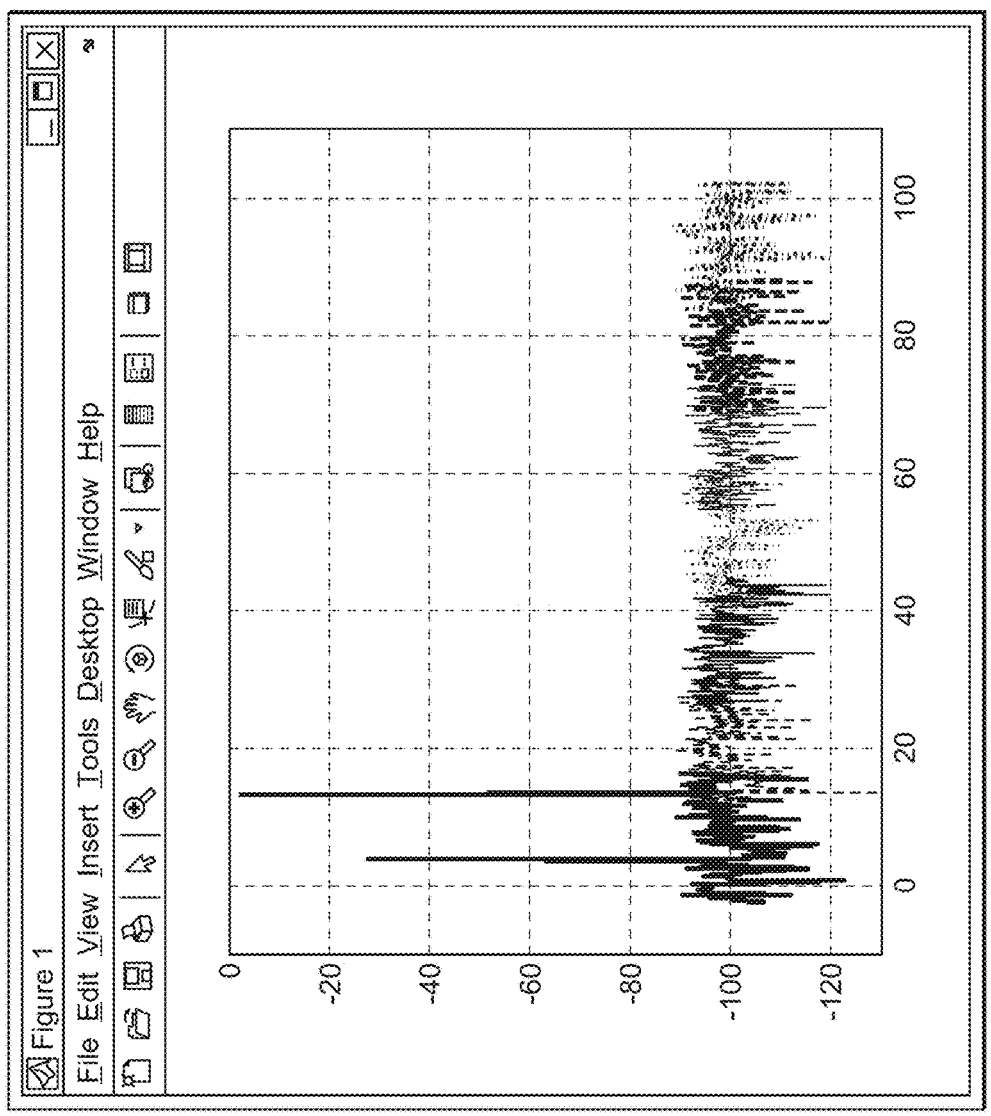
FIGS. 4A and 4B include frequency spectra for real-input 4/3 oversampled 14-channel channelizer without phase compensation and with phase compensation, respectively, according to exemplary embodiments.
Figure 4B:
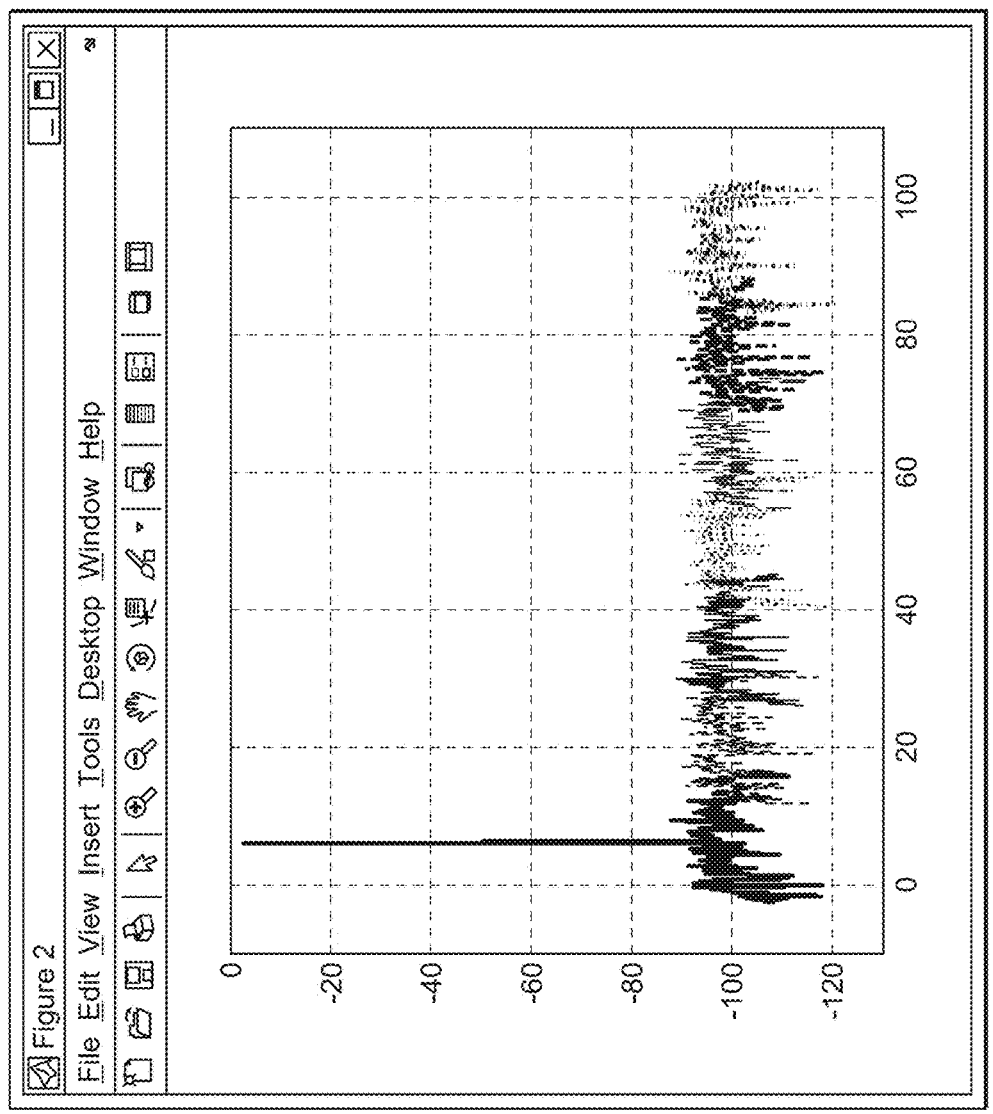

Thus, according to the present disclosure, non-integer oversampling or undersampling rates relative to the number of channels result in non-linear phase offsets in each of the channels. According to the exemplary embodiments, phase compensation is introduced to compensate for the non-linear phase offsets. In contrast, in conventional channelizers, the frequency spectrum would be rotated, i.e., linear phase offsets. FIGS. 4A and 4B include frequency spectra for real-input 4/3 oversampled 14-channel channelizer without phase compensation and with phase compensation, respectively, according to exemplary embodiments.

Thus, the exemplary embodiments provide digital channelization of a spectrum to non-integer ratios relative to the number of channels. This approach combines an interpolation filter with the digital channelizer and corrects for non-linear phase offsets on the output channels.

The following describes in more detail the channelizer 220 and non-linear phase correction channel centering block 222 of FIG. 3B, according to the exemplary embodiments, in greater detail.

The interpolating channelizer 220 implements a resampling filter for the filter portion of the channelizer 220. A resampling filter up-samples by L and decimates by M. Up-sampling is needed if L/M is not an integer. For example, if it is desirable to downsample the signal by 1.5, it is necessary to discard every 1.5 samples. This is accomplished by up-sampling by 2, and decimating by 3. The processing produces a fractional delay of ½ samples where needed by interpolating the data.

For a typical channelizer, new samples are shifted into the polyphase filter structure at a constant rate, which results in the linear nature of the phase offsets needed. When M does not equal N, this has the effect of multiplying a spectrum by a linear changing phase offset, which rotates the spectrum. In contrast, for the interpolating channelizer 220 of the exemplary embodiments, the new samples are shifted into the polyphase structure at a non-linear rate which results in non-linear phase offsets. The spectrum information is modified such that it does not represent the spectrum without compensating for the non-linear phase offsets.

For example, a channelizer where N=4 and downsample rate=3 (4/3 oversampled, L=1, M=3), there are 4 filter branches in the polyphase filter, which receive 3 new samples every downsampled clock rate. A channelizer where N=6 and downsample rate=4.5 (4/3 oversampled, L=2, M=9), there are 6 filter branches in the resampling polyphase filter which receive 4 and 5 samples every other clock. As with a resampling filter, the branches alternate between two different sets of coefficients every other clock.

The derivation of a channelizer starts with a mixer, a low pass filter, and a decimation. The channelizer equation is derived by use of the Noble identity, polyphase filter structures, and a fast Fourier transform (FFT).

N=number of channels
M=decimation factor
k=channel index
t=decimated time
$h_n(m)=h(n+Nm)$
$x_{Mt}(n)=x(Mt+n)$
Total taps in the filter=T*N $$y_k(t) = \left[\sum_{n=0}^{TAPS-1} \left(e^{\frac{-2\pi j(t-n)k}{N}} * x(t-n)\right) * h(n)\right][M\downarrow]$$

$$y_k(t) = \left[\sum_{n=0}^{N-1}\sum_{m=0}^{T-1} x_{Mt}(n-mN) * h_n(m) * e^{\frac{-2\pi jnk}{N}}\right] * e^{\frac{-2\pi jMtk}{N}}$$

The first portion of the channelizer 220 matches the form of a standard polyphase filter. For a downsampled polyphase filter design, the polyphase branches are chosen such that the number of branches equals the downsample rate. This produces the most efficient structure as branches are independent of each other. For an oversampled or undersampled channelizer, the number of polyphase branches equals the number of channels in order to match the throughput requirement of the FFT portion of the channelizer. The result is the branches share data with other branches depending on the ratio of M and N. Also, due to the mismatched number of channels and the decimation rate, the FFT portion results in phase components which are variable in channels and variable linearly in time. Without applying the phase component, each of the output channels spectrums will be rotated and the centers of the channels are not at DC.

Similarly, an interpolated channelizer according to the exemplary embodiments is derived from a mixer and a resampling filter.

$$y_k(t) = \left[\sum_{n=0}^{TAPS-1} \left[\left(e^{\frac{-2\pi j(t-n)k}{N}} * x(t-n)\right)[L\uparrow]\right] * h(n)\right][M\downarrow]$$

It is convenient to form the summation in reverse order from TAP-1 to 0, so that the summation increments with t. At the end of the derivation, the branches of the polyphase map directly to the indexes of the FFT rather than in reverse order. This is equivalent to adding a time offset (t+TAPS-1). This is removed from the equation for convenience. The equation is modified by substituting –n for n, and replacing h(n) with $\bar{h}(n)=h$ (TAPS-1-n).

$$y_k(t) = \left[\sum_{n=0}^{TAPS-1} \left[\left(e^{\frac{-2\pi j(t+n)k}{N}} * x(t+n)\right)[L\uparrow]\right] * \bar{h}(n)\right][M\downarrow]$$

Up-sampling by L results in:

$$y_k(t) = \left[\sum_{n=0}^{TAPS-1} e^{\frac{-2\pi j(floor(\frac{t}{L})+n)k}{N}} * x\left(floor\left(\frac{t}{L}\right)+n\right) * \bar{h}(nL+t\bmod L)\right][M\downarrow]$$

Converting to polyphase filter of branches N allows the mixer to be constant for each polyphase branch.

$$y_k(t) = \left[\sum_{n=0}^{N-1}\sum_{m=0}^{T-1} e^{\frac{-2\pi j(floor(\frac{t}{L})+(n+mN))k}{N}} * \right.$$

$$\left. x\left(floor\left(\frac{t}{L}\right)+(n+mN)\right) * \bar{h}((n+mN)L+t\bmod L)\right][M\downarrow]$$

$$y_k(t) = \left[\sum_{n=0}^{N-1}\sum_{m=0}^{T-1} e^{\frac{-2\pi j(floor(\frac{Mt}{L})+(n+mN))k}{N}} * x\left(floor\left(\frac{Mt}{L}\right)+(n+mN)\right) * \right.$$

$$\left. \bar{h}(nL+mNL+M t\bmod L)\right]$$

$$y_k(t) = \left[\sum_{n=0}^{N-1}\sum_{m=0}^{T-1} e^{\frac{-2\pi j(floor(\frac{Mt}{L}))k}{N}} * e^{\frac{-2\pi jnk}{N}} * e^{\frac{-2\pi jmNk}{N}} * \right.$$

$$\left. x\left(floor\left(\frac{Mt}{L}\right)+n+mN\right) * \bar{h}(mNL+nL+M t\bmod L)\right]$$

$$y_k(t) = e^{\frac{-2\pi j(floor(\frac{Mt}{L}))k}{N}} * \left[\sum_{n=0}^{N-1}\left[\sum_{m=0}^{T-1} x_{floor(\frac{Mt}{L})t}(n+mN) * \bar{h}_{nL+M t\bmod L}(m)\right] * \right.$$

$$\left. e^{\frac{-2\pi jnk}{N}}\right]$$

The result is a resampling filter whose branch results are the inputs into an FFT. The result is multiplied by a phase coefficient dependent on time and channel. The polyphase resampling filter shifts new data across each branch at a non-linear rate, represented by floor(Mt/L)t. This is the same rate non-linear amount that the phase coefficients change. The phase coefficients can also apply patent application 13-4463, and replace the non-linear phase multiply with a rotation of the branch outputs prior to the FFT. The derivation is similar for a half-channel shifted channelizer, to replace the non-linear phase multiply with a data rotation of the filter branch outputs.

Example

4/3 oversampling for N=6
N=6; L=2; M=9

$$y_k(t) =$$

$$e^{\frac{-2\pi j(floor(\frac{9t}{2}))k}{6}} * \left[\sum_{n=0}^{5}\left[\sum_{m=0}^{T-1} x_{floor(\frac{9t}{2})t}(n+m6) * \bar{h}_{n2+9tmod2}(m)\right] * e^{\frac{-2\pi jnk}{6}}\right]$$

$$y_k(t) =$$

$$e^{\frac{-2\pi j(floor(4.5t))k}{6}} * \left[\sum_{n=0}^{5}\left[\sum_{m=0}^{T-1} x_{floor(4.5)t}(n+6m) * \bar{h}_{2n+tmod2}(m)\right] * e^{\frac{-2\pi jnk}{6}}\right]$$

Up-converting x(t) by 2 yields x(0), 0, x(1), 0, x(2), 0, . . . . For L=2, there the filter is separated into 2*N=12 polyphase branches. The interpolation calculated is represented by $\bar{h}_{2n+t\ mod\ 2}(m)$. For the samples for $y_k$(t+1), the nine samples are shifted into the filter (M=9), half of which are zeros. This results in the other half of the branches to be calculated. For every other clock, four then five samples of x(t) are shifted into the filter, and the calculated branches alternate. The results of the branches are the input into a six point FFT, which is then multiplied the non-linear coefficient.

Various embodiments of the above-described systems and methods may be implemented in digital electronic circuitry, in computer hardware, firmware, and/or software. The implementation can be as a computer program product (i.e., a computer program tangibly embodied in an information carrier). The implementation can, for example, be in a machine-readable storage device and/or in a propagated signal, for execution by, or to control the operation of, data processing apparatus. The implementation can, for example, be a programmable processor, a computer, and/or multiple computers.

A computer program can be written in any form of programming language, including compiled and/or interpreted languages, and the computer program can be deployed in any form, including as a stand-alone program or as a subroutine, element, and/or other unit suitable for use in a computing environment. A computer program can be deployed to be executed on one computer or on multiple computers at one site.

Method steps can be performed by one or more programmable processors executing a computer program to perform functions of the invention by operating on input data and generating output. Method steps can also be performed by and an apparatus can be implemented as special purpose logic circuitry. The circuitry can, for example, be a FPGA (field programmable gate array) and/or an ASIC (application-specific integrated circuit). Modules, subroutines, and software agents can refer to portions of the computer program, the processor, the special circuitry, software, and/or hardware that implements that functionality.

Processors suitable for the execution of a computer program include, by way of example, both general and special purpose microprocessors, and any one or more processors of any kind of digital computer. Generally, a processor receives instructions and data from a read-only memory or a random access memory or both. The essential elements of a computer are a processor for executing instructions and one or more memory devices for storing instructions and data. Generally, a computer can include, can be operatively coupled to receive data from and/or transfer data to one or more mass storage devices for storing data (e.g., magnetic, magneto-optical disks, or optical disks).

Data transmission and instructions can also occur over a communications network. Information carriers suitable for embodying computer program instructions and data include all forms of non-volatile memory, including by way of example semiconductor memory devices. The information carriers can, for example, be EPROM, EEPROM, flash memory devices, magnetic disks, internal hard disks, removable disks, magneto-optical disks, CD-ROM, and/or DVD-ROM disks. The processor and the memory can be supplemented by, and/or incorporated in special purpose logic circuitry.

To provide for interaction with a user, the above described techniques can be implemented on a computer having a display device. The display device can, for example, be a cathode ray tube (CRT) and/or a liquid crystal display (LCD) monitor. The interaction with a user can, for example, be a display of information to the user and a keyboard and a pointing device (e.g., a mouse or a trackball) by which the user can provide input to the computer (e.g., interact with a user interface element). Other kinds of devices can be used to provide for interaction with a user. Other devices can, for example, be feedback provided to the user in any form of sensory feedback (e.g., visual feedback, auditory feedback, or tactile feedback). Input from the user can, for example, be received in any form, including acoustic, speech, and/or tactile input.

The above described techniques can be implemented in a distributed computing system that includes a back-end component. The back-end component can, for example, be a data server, a middleware component, and/or an application server. The above described techniques can be implemented in a distributing computing system that includes a front-end component. The front-end component can, for example, be a client computer having a graphical user interface, a Web browser through which a user can interact with an example implementation, and/or other graphical user interfaces for a transmitting device. The components of the system can be interconnected by any form or medium of digital data communication (e.g., a communication network). Examples of communication networks include a local area network (LAN), a wide area network (WAN), the Internet, wired networks, and/or wireless networks.

The system can include clients and servers. A client and a server are generally remote from each other and typically interact through a communication network. The relationship of client and server arises by virtue of computer programs running on the respective computers and having a client-server relationship to each other.

Packet-based networks can include, for example, the Internet, a carrier internet protocol (IP) network (e.g., local area network (LAN), wide area network (WAN), campus area network (CAN), metropolitan area network (MAN), home area network (HAN)), a private IP network, an IP private branch exchange (IPBX), a wireless network (e.g., radio access network (RAN), 802.11 network, 802.16 network, general packet radio service (GPRS) network, HiperLAN), and/or other packet-based networks. Circuit-based networks can include, for example, the public switched telephone network (PSTN), a private branch exchange (PBX), a wireless network (e.g., RAN, Bluetooth, code-division multiple access (CDMA) network, time division multiple access (TDMA) network, global system for mobile communications (GSM) network), and/or other circuit-based networks.

The computing device can include, for example, a computer, a computer with a browser device, a telephone, an IP phone, a mobile device (e.g., cellular phone, personal digital assistant (PDA) device, laptop computer, electronic mail device), and/or other communication devices. The browser device includes, for example, a computer (e.g., desktop computer, laptop computer) with a World Wide Web browser (e.g., Microsoft® Internet Explorer® available from Microsoft Corporation, Mozilla® Firefox available from Mozilla Corporation). The mobile computing device includes, for example, a Blackberry®, iPAD®, iPhone® or other smartphone device.

Whereas many alterations and modifications of the disclosure will no doubt become apparent to a person of ordinary skill in the art after having read the foregoing description, it is to be understood that the particular embodiments shown and described by way of illustration are in no way intended to be considered limiting. Further, the subject matter has been described with reference to particular embodiments, but variations within the spirit and scope of the disclosure will occur to those skilled in the art. It is noted that the foregoing examples have been provided merely for the purpose of explanation and are in no way to be construed as limiting of the present disclosure.

Although the present disclosure has been described herein with reference to particular means, materials and embodiments, the present disclosure is not intended to be limited to the particulars disclosed herein; rather, the present disclosure extends to all functionally equivalent structures, methods and uses, such as are within the scope of the appended claims.

The invention claimed is:

1. A method for interpolating non-integer oversamples in a receiver, comprising:
   receiving a plurality of samples, the plurality of samples having a quantity which has a non-integer decimation rate as applied to a channelizer of the receiver; and
   applying a non-linear phase correction to the plurality of samples, wherein the non-linear phase correction is applied in accordance with $$y_k(t) = e^{\frac{-2\pi j(floor(\frac{Mt}{L}))k}{N}} * \left[ \sum_{n=0}^{N-1} \left[ \sum_{m=0}^{T-1} x_{floor(\frac{Mt}{L})t}(n+mN) * \overline{h}_{nL+MtmodL}(m) \right] * e^{\frac{-2\pi jnk}{N}} \right];$$

where x=input samples, y=channelized output data, h=prototype channelizer coefficients, t=decimated time, k=channel index, N=number of channels, T=number of taps per branch; M=decimation factor, L=upsample factor, M/L=overall decimation factor which can be non-integer, $h_n(m)=h(n+Nm)$, $x_{Mt}(n)=x(Mt+n)$, and total taps in the filter=T*N.

2. The method of claim 1, wherein the non-linear phase correction is applied via a complex phase shift as described by $e^{-2\pi j(floor(Mt/L))k/N}$.

3. The method of claim 1, wherein the non-linear phase correction is applied via a multiplexor/negation operation.

4. A receiver system for interpolating non-integer oversamples, comprising:
   an input for receiving a plurality of samples, the plurality of samples having a quantity which has a non-integer decimation rate as applied to a channelizer of the receiver; and
   a processor for applying a non-linear phase correction to the plurality of samples, wherein the non-linear phase correction is applied in accordance with $$y_k(t) = e^{\frac{-2\pi j(floor(\frac{Mt}{L}))k}{N}} * \left[ \sum_{n=0}^{N-1} \left[ \sum_{m=0}^{T-1} x_{floor(\frac{Mt}{L})t}(n+mN) * \overline{h}_{nL+MtmodL}(m) \right] * e^{\frac{-2\pi jnk}{N}} \right];$$

where x=input samples, y=channelized output data, h=prototype channelizer coefficients, t=decimated time, k=channel index, N=number of channels, T=number of taps per branch; M=decimation factor, L=upsample factor, M/L=overall decimation factor which can be non-integer, $h_n(m)=h(n+Nm)$, $x_{Mt}(n)=x(Mt+n)$, and total taps in the filter=T*N.

5. The system of claim 4, wherein the non-linear phase correction is applied via a complex phase shift as described by $e^{-2\pi j(floor(Mt/L))k/N}$.

6. The system of claim 4, wherein the non-linear phase correction is applied via a multiplexor/negation operation.

* * * * *